United States Patent
You et al.

(10) Patent No.: US 10,475,739 B2
(45) Date of Patent: Nov. 12, 2019

(54) SEMICONDUCTOR DEVICE

(71) Applicant: SAMSUNG ELECTRONICS CO., LTD., Suwon-si, Gyeonggi-do (KR)

(72) Inventors: Woo Kyung You, Hwaseong-si (KR); Eui Bok Lee, Seoul (KR); Jong Min Baek, Seoul (KR); Su Hyun Bark, Suwon-si (KR); Jang Ho Lee, Hwaseong-si (KR); Sang Hoon Ahn, Goyang-si (KR); Hyeok Sang Oh, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/840,128

(22) Filed: Dec. 13, 2017

(65) Prior Publication Data
US 2019/0043803 A1    Feb. 7, 2019

(30) Foreign Application Priority Data
Aug. 2, 2017   (KR) ........................ 10-2017-0098008

(51) Int. Cl.
*H01L 23/522*    (2006.01)
*H01L 23/532*    (2006.01)
(Continued)

(52) U.S. Cl.
CPC .... *H01L 23/5226* (2013.01); *H01L 21/76804* (2013.01); *H01L 21/76832* (2013.01);
(Continued)

(58) Field of Classification Search
CPC .......... H01L 21/76832; H01L 23/5226; H01L 23/5283; H01L 21/76804; H01L 21/76834;
(Continued)

(56) References Cited

U.S. PATENT DOCUMENTS 6,245,690 B1 * 6/2001 Yau ...................... C23C 16/401
                                                    257/E21.263
6,440,838 B1   8/2002 Lui et al.
(Continued)

FOREIGN PATENT DOCUMENTS

CN          106876324 A     6/2017
KR     10-2004-0071631 A    8/2004
KR     10-2016-0045550 A    4/2016

OTHER PUBLICATIONS

Singapore Search Report and Written Opinion (dated Aug. 8, 2018) issued by the IPOS for Singapore patent application No. 10201803467S which was filed Apr. 25, 2018.

*Primary Examiner* — Phat X Cao
*Assistant Examiner* — Diana C Vieira
(74) *Attorney, Agent, or Firm* — Lee & Morse, P.C.

(57) ABSTRACT

A semiconductor device is provided. The semiconductor device includes a substrate comprising a lower wire, an etch stop layer on the substrate, an interlayer insulating layer on the etch stop layer, an upper wire disposed in the interlayer insulating layer and separated from the lower wire and a via formed in the interlayer insulating layer and the etch stop layer and connecting the lower wire with the upper wire, wherein the via comprises a first portion in the etch stop layer and a second portion in the interlayer insulating layer, and wherein a sidewall of the first portion of the via increases stepwise.

20 Claims, 22 Drawing Sheets

(51) Int. Cl.
*H01L 23/528* (2006.01)
*H01L 21/768* (2006.01)

(52) U.S. Cl.
CPC .... *H01L 21/76834* (2013.01); *H01L 23/5283* (2013.01); *H01L 23/53295* (2013.01)

(58) Field of Classification Search
CPC ......... H01L 21/76829; H01L 23/53295; H01L 2221/1057; H01L 21/76802; H01L 21/486; H01L 23/481
See application file for complete search history.

(56) References Cited

U.S. PATENT DOCUMENTS

| | | |
|---|---|---|
| 6,525,428 B1 | 2/2003 | Ngo et al. |
| 7,382,055 B2 | 6/2008 | Coker et al. |
| 7,391,115 B2 | 6/2008 | Usami et al. |
| 7,910,474 B2 | 3/2011 | Usami et al. |
| 9,437,484 B2 | 9/2016 | Jangjian et al. |
| 9,536,964 B2 | 1/2017 | Shiao et al. |
| 2003/0134521 A1 | 7/2003 | Guo et al. |
| 2004/0155342 A1 | 8/2004 | Usami et al. |
| 2008/0194102 A1 | 8/2008 | Usami et al. |
| 2015/0162239 A1* | 6/2015 | Nguyen ............ H01L 21/02244 438/702 |
| 2015/0171007 A1* | 6/2015 | Huang ................ H01L 23/5226 257/774 |
| 2016/0111325 A1 | 4/2016 | Jangjian et al. |
| 2016/0358854 A1 | 12/2016 | Jangjian et al. |
| 2016/0372413 A1 | 12/2016 | Mahalingam et al. |
| 2017/0092580 A1 | 3/2017 | Huang et al. |
| 2017/0278742 A1* | 9/2017 | Chen ................ H01L 21/76804 |

\* cited by examiner

FIG. 3
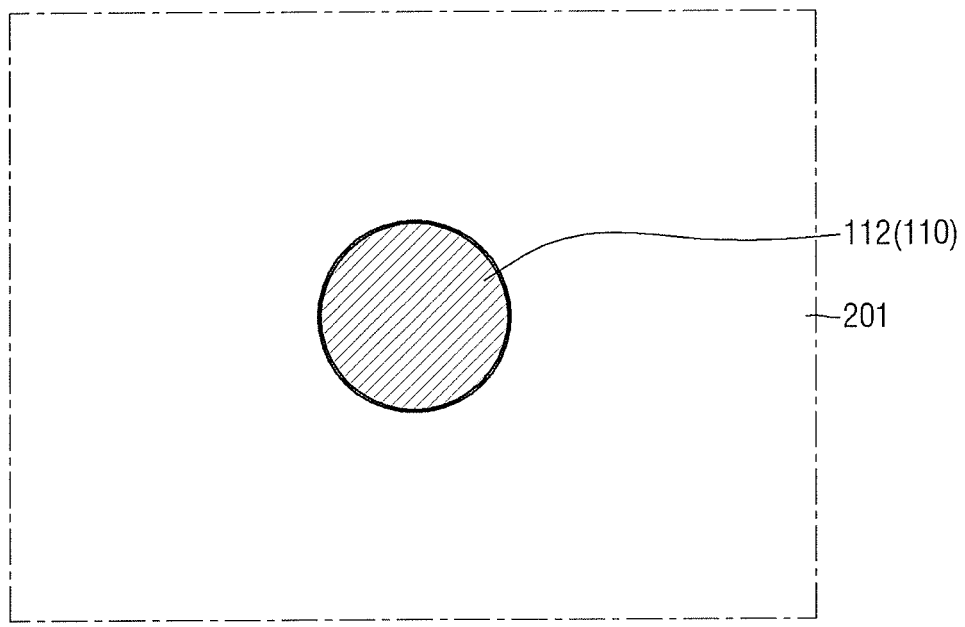
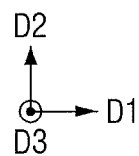

FIG. 18
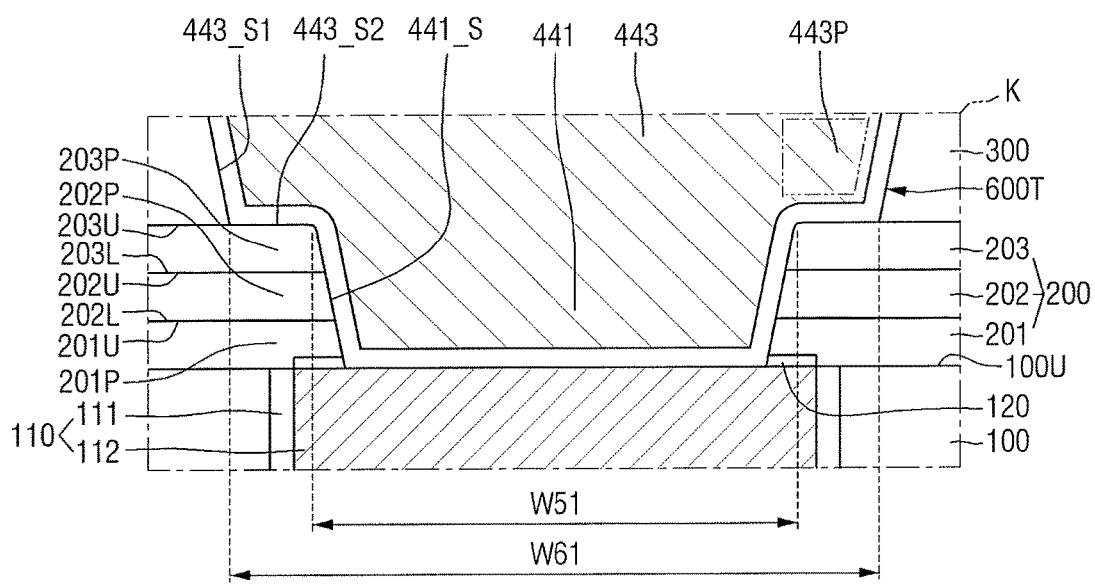
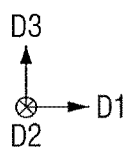

SEMICONDUCTOR DEVICE

This application claims priority to Korean Patent Application No. 10-2017-0098008 filed on Aug. 2, 2017, in the Korean Intellectual Property Office, the disclosure of which is incorporated herein by reference in its entirety.

BACKGROUND

1. Technical Field

The present disclosure relates to a semiconductor device.

2. Description of the Related Art

As electronic technology evolves, down-scaling of semiconductor devices has been rapidly progressed. Accordingly, it is required to fabricating semiconductor chips having high integration and low power consumption. To do so, the spacing between the circuit elements such as the wires become smaller, and thus there may be a problem of leakage. In addition, to fabricate semiconductor chips having high integration and low power consumption, the aspect ratio of the wire layer is increased. Various studies have been made to form a wire layer having increased aspect ratio without a defect.

SUMMARY

Aspects of the present disclosure provide a semiconductor device capable of suppressing leakage between a lower wire and a via.

According to some embodiments of the present inventive concepts, there is provided a semiconductor device comprising a substrate comprising a lower wire, an etch stop layer on the substrate, an interlayer insulating layer on the etch stop layer, an upper wire disposed in the interlayer insulating layer and separated from the lower wire and a via formed in the interlayer insulating layer and the etch stop layer and connecting the lower wire with the upper wire, wherein the via comprises a first portion in the etch stop layer and a second portion in the interlayer insulating layer, and wherein a sidewall of the first portion of the via increases stepwise.

According to some embodiments of the present inventive concepts, there is provided a semiconductor device comprising a substrate comprising a lower wire, an etch stop layer comprising a lower etch stop pattern and an upper etch stop pattern stacked on the substrate sequentially, an interlayer insulating layer on the upper etch stop pattern, a trench formed in the interlayer insulating layer and in the etch stop layer to expose the lower wire, a via used to fill the trench defined by the etch stop layer and a part of the interlayer insulating layer and an upper wire disposed on and connected to the via and used to fill the trench, wherein a width of the trench defined by the lower etch stop pattern is smaller than a width of the trench defined by the upper etch stop pattern at a boundary between the lower etch stop pattern and the upper etch stop pattern.

According to some embodiments of the present inventive concepts, there is provided a semiconductor device comprising a substrate comprising a lower wire, an etch stop layer comprising first to third etch stop patterns stacked on the substrate sequentially, an interlayer insulating layer disposed on the third etch stop pattern, an upper wire disposed in the interlayer insulating layer and separated from the lower wire and a via formed in the interlayer insulating layer and the etch stop layer and connecting the lower wire with the upper wire, wherein the first etch stop pattern and the third etch stop pattern comprises a same material, and wherein the second etch stop pattern comprises a different material from the material of the first and third etch stop pattern.

According to some embodiments of the present inventive concepts, there is provided a semiconductor device comprising a substrate comprising a lower wire, an etch stop layer comprising a lower etch stop pattern and an upper etch stop pattern stacked on the substrate sequentially, an interlayer insulating layer disposed on the upper etch stop pattern, an upper wire disposed in the interlayer insulating layer and comprising a longer side extended in a first direction and a via formed in the interlayer insulating layer and in the etch stop layer and connecting the lower wire with the upper wire, wherein a first width of the via in the lower etch stop pattern in the first direction is smaller than a second width of the via in the upper etch stop pattern in the first direction at a boundary between the lower etch pattern and the upper etch stop pattern.

BRIEF DESCRIPTION OF THE DRAWINGS

The above and other aspects and features of the present disclosure will become more apparent by describing in detail exemplary embodiments thereof with reference to the attached drawings, in which:

FIG. 3 is a plan view taken along line C-C' of FIG. 2;

FIG. 18 is an enlarged view of area K of FIG. 17; and

DETAILED DESCRIPTION OF THE EMBODIMENTS

Hereinafter, a semiconductor device according to some exemplary embodiments of the present disclosure will be described with reference to FIGS. 1 to 10.

Figure 1:
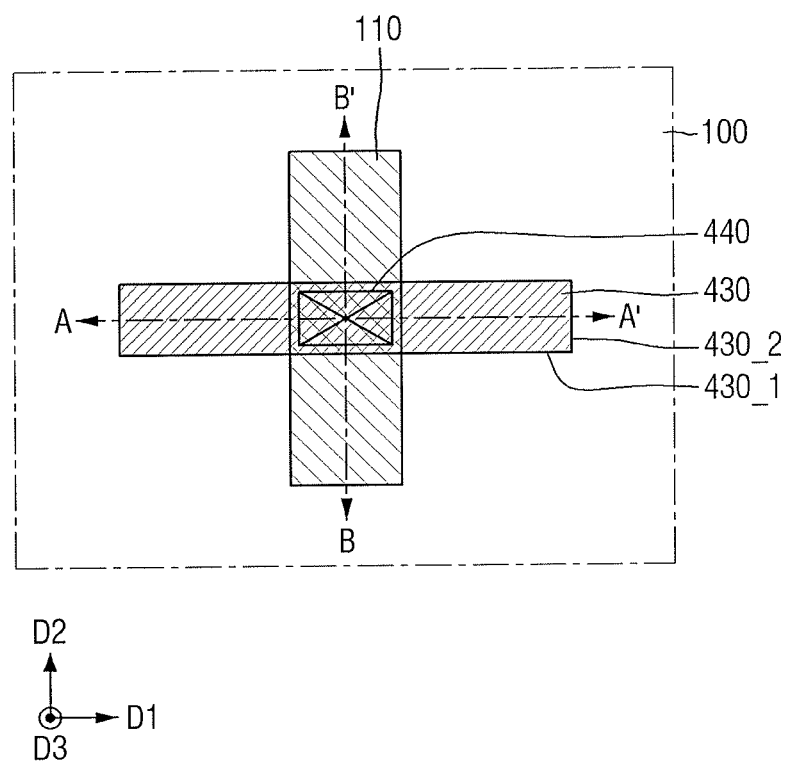
FIG. 1 is a diagram for illustrating a layout of a semiconductor device according to some exemplary embodiments of the present disclosure.
Figure 2:
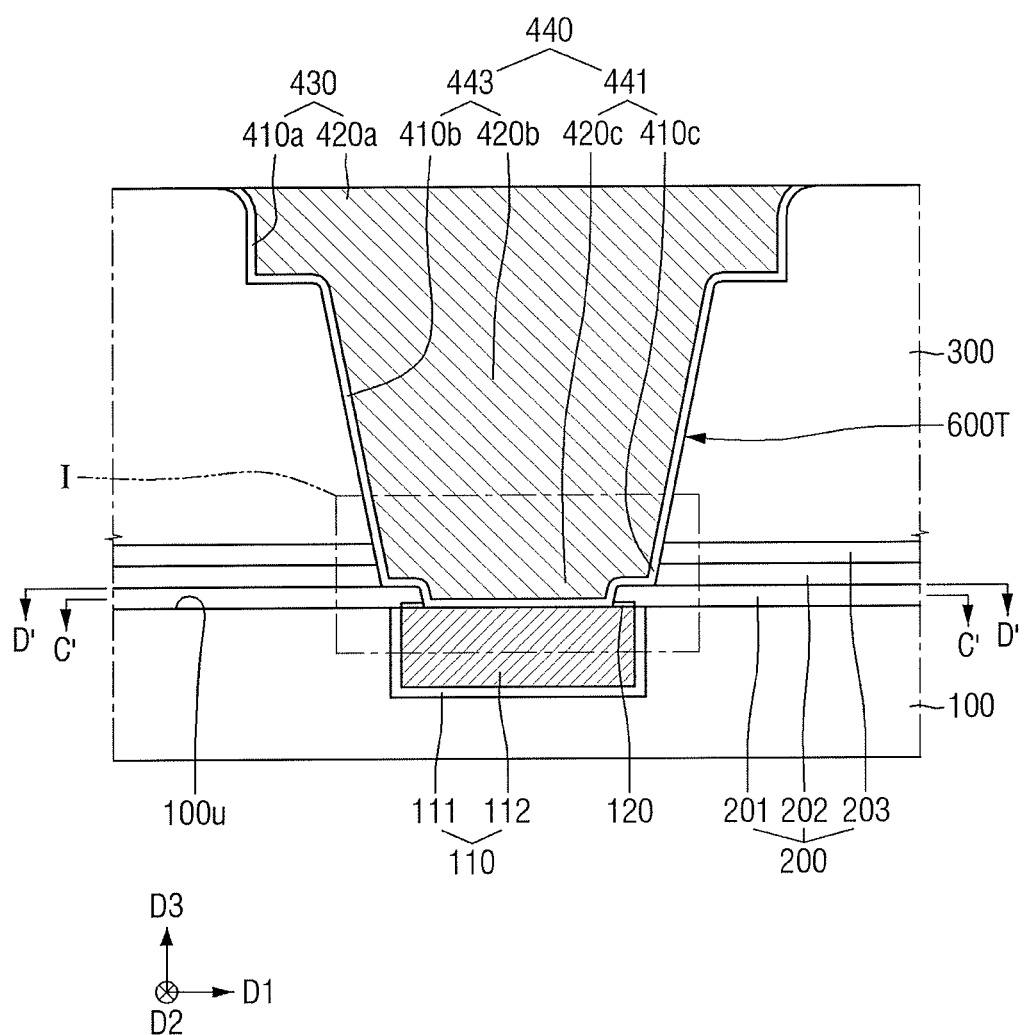
FIG. 2 is a cross-sectional view taken along line A-A' of FIG. 1 according to an embodiment.

FIG. 1 is a diagram for illustrating a layout of a semiconductor device according to some exemplary embodiments of the present disclosure. FIG. 2 is a cross-sectional view taken along line A-A' of FIG. 1 according to an embodiment.

Referring to FIGS. 1 and 2, a semiconductor device according to some exemplary embodiments of the present disclosure may include a substrate 100, a lower wire 110, an upper wire 430, an etch stop layer 200, and a via 440.

According to some exemplary embodiments of the present disclosure, the upper wire 430 and the lower wire 110 may extend in directions intersecting with each other. For example, the upper wire 430 may include a longer side 430_1 extending in a first direction D1 and a shorter side 430_2 extending in a second direction D2. The lower wire 110 may extend in the second direction D2 in which the shorter side 430_2 of the upper wire 430 extends. The via 440 may extend in a third direction D3 at a region where the upper wire 430 and the lower wire 110 overlap with each other.

For example, the first direction D1 may be substantially parallel to an upper surface 100U of the substrate 100. For example, the third direction D3 may be perpendicular to and away from the upper surface 100U of the substrate 100. The second direction D2 may intersect with the first direction D1 and the third direction D3.

The substrate 100 may have, but is not limited to, a structure in which a base substrate and an epitaxial layer are stacked. The substrate 100 may be a silicon substrate, a gallium arsenide substrate, a silicon germanium substrate, a ceramic substrate, a quartz substrate, a glass substrate for a display, or a semiconductor on insulator (SOI) substrate. In the following description, a silicon substrate will be described as an example of the substrate 100. In an embodiment, the substrate 100 may be formed by disposing an insulating layer on a silicon substrate.

The substrate 100 may include the lower wire 110. In an embodiment, the lower wire 110 is a metal wire. The lower wire 110 may be a transistor, a diode, or the like formed in the substrate 100, and may be, for example, a gate electrode or a source/drain of a transistor.

The lower wire 110 may include a conductive material.

The lower wire 110 may include a lower barrier layer 111 and a lower wire layer 112.

The lower barrier layer 111 may be formed between the lower wire layer 112 and the substrate 100. The lower barrier layer 111 may be formed along a recess in the substrate 100, for example. Although the lower barrier layer 111 is shown as a single layer, it is to be understood that it may include a plurality of layers.

The lower barrier layer 111 may include, but is not limited to, at least one of tantalum, tantalum nitride, titanium, titanium nitride, ruthenium, cobalt, nickel, nickel boron (NiB) and tungsten nitride.

For example, the recess in the substrate 100 may be filled with the lower wire layer 112 after the lower barrier layer 111 is formed in the recess.

The lower wire layer 112 may include at least one of aluminum (Al), copper (Cu), tungsten (W), cobalt (Co), and a combination thereof, for example.

The capping layer 120 may be disposed on a part of the upper surface of the lower wire layer 112. The capping layer 120 may protrude from the upper surface 100U of the substrate 100 according to an embodiment. Although the capping layer 120 is illustrated as being disposed only on a part of the upper surface of the lower wire layer 112 and not extending to the upper surface of the lower barrier layer 111 in the drawings, this is merely illustrative. For example, it is to be understood that the capping layer 120 may be disposed such that it extends to the upper surface of the lower barrier layer 111 from the part of the upper surface of the lower wire layer 112.

Further, the capping layer 120 may be omitted according to an embodiment.

The etch stop layer 200 may be disposed on the substrate 100 including the lower wire 110. The etch stop layer 200 may include, for example, a portion of a trench 600T penetrating the etch stop layer 200.

The etch stop layer 200 may include, for example, a first etch stop pattern 201, a second etch stop pattern 202 and a third etch stop pattern 203. The first etch stop pattern 201, the second etch stop pattern 202 and the third etch stop pattern 203 may be stacked on the substrate 100 in this order. In some exemplary embodiment of the present disclosure, a lower etch stop pattern may include the first etch stop pattern 201, and an upper etch stop pattern may include the second etch stop pattern 202 and the third etch stop pattern 203.

In some exemplary embodiment of the present disclosure, the first etch stop pattern 201 and the third etch stop pattern 203 may comprise a same element.

The first etch stop pattern 201 and the third etch stop pattern 203 may comprise, for example, a metal. For example, the first etch stop pattern 201 and the third etch stop pattern 203 may contain a same metal. The second etch stop pattern 202 may not include the metal element included in the first etch stop pattern 201 and the third etch stop pattern 203.

For example, the first etch stop pattern 201 and the third etch stop pattern 203 may include aluminum (Al) element, while the second etch stop pattern 202 may include oxide doped carbon (ODC) and/or SiCN. The first etch stop pattern 201 may include AlN, and the third etch stop pattern may include AlOC.

The second etch stop pattern 202 may include a material different from the material included in the first etch stop pattern 201 and the third etch stop pattern 203.

For example, the first etch stop pattern 201 and the third etch stop pattern 203 may include a material having an etch selectivity with the second etch stop pattern 202.

An interlayer insulating layer 300 may be disposed on the etch stop layer 200. In an embodiment, the interlayer insulating layer 300 may be disposed on the third etch stop pattern 203. The interlayer insulating layer 300 may include at least one of, for example, silicon oxide, silicon nitride, silicon oxynitride and a low-k material. The interlayer insulating layer 300 may include a material having an etch selectivity with the third etch stop pattern 203.

FIG. 3 is a plan view taken along line C-C' of FIG. 2.

Referring to FIGS. 2 and 3, the trench 600T may be formed in the interlayer insulating layer 300 and the etch stop layer 200. The trench 600T may be formed by penetrating the interlayer insulating layer 300 and the etch stop layer 200 to expose the lower wire 110.

In the semiconductor process for forming the trench 600T, a top corner rounding (TCR) process may be performed on the interlayer insulating layer 300 exposed via the trench 600T.

By performing the TCR process, the corner portions where the upper surface of the interlayer insulating layer 300 meet the sidewalls of the trench 600T may be rounded. That is, by performing the TCR process, the top of the trench 600T may be rounded.

According to some exemplary embodiments of the present disclosure, by performing the TCR process during the process of fabricating a semiconductor device, the rounded top of the trench 600T may facilitate the formation of the via 440 and the upper wire 430 during subsequent processes. For example, as the top of the trench 600T is rounded, the width of the top of the trench 600T may be increased, so that the trench 600T can be filled with the via 440 and the upper wire 430.

Although it has been described that the portions where the upper surface of the interlayer insulating layer 300 meets the sidewalls of the trench 600T are rounded by the TCR process of the processes of fabricating semiconductor devices according to some exemplary embodiments of the present disclosure, it is to be understood that this is merely illustrative. That is, it is to be noted that the TCR process may be an optional process, and thus may be omitted.

The edges of the first etch stop pattern 201 exposed via the trench 600T may be rounded by an etching process or the like of the processes of fabricating semiconductor devices.

The trench 600T may include the portion penetrating the interlayer insulating layer 300 and the portion penetrating the etch stop layer 200. According to some exemplary embodiments of the present disclosure, the portion of the trench 600T that penetrates the etch stop layer 200 may include a portion defined by the first etch stop pattern 201 and a portion defined by the second etch stop pattern 202 and the third etch stop pattern 203.

According to some exemplary embodiments of the present disclosure, at the boundary between the first etch stop pattern 201 and the second etch stop pattern 202, the width of the portion of the trench 600T defined by the first etch stop pattern 201 may be smaller than the width of the portion of the trench 600T defined by the second etch stop pattern 202 and the third etch stop pattern 203.

The portion of the trench 600T defined by the first etch stop pattern 201 included in the lower etch stop pattern may correspond to a third portion 441_1 (see FIG. 4) of the via 440. The portion of the trench 600T defined by the second etch stop pattern 202 and the third etch stop pattern 203 included in the upper etch stop pattern may correspond to a fourth portion 441_2 of the via 440 (see FIG. 4).

Referring back to FIGS. 1 and 2, upper barrier layers 410a, 410b and 410c may be formed along the sidewalls and the bottom surface of the trench 600T.

The upper barrier layers 410a, 410b and 410c may include a first portion 410a of the upper barrier layer adjacent to an upper wire layer 420a, a second portion 410b of the upper barrier layer adjacent to a second via material 420b of the via 440, and a third portion 410c of the upper barrier layer adjacent to a first via material 420c of the via 440.

The remaining portion of the trench 600T after the upper barrier layers 410a, 410b and 410c are formed may be filled with the upper wire layer 420a, the first via material 420c and the second via material 420b.

In other words, the trench 600T may be filled by the upper wire 430 and the via 440. Specifically, the via 440 may be used to fill the trench 600T defined by the etch stop layer 200 and a part of the interlayer insulating layer 300. In an embodiment, the upper wire 430 may be connected to and disposed on the via 440 and may be used to fill the trench 600T.

The via 440 may be disposed inside the etch stop layer 200 and the interlayer insulating layer 300 and may connect the lower wire 110 with the upper wire 430. The via 440 may be disposed at the intersection between the upper wire 430 and the lower wire 110.

The via 440 may include a first portion 441 in the etch stop layer 200 and a second portion 443 in the interlayer insulating layer 300.

The first portion 441 of the via 440 may include the first via material 420c and the third portion 410c of the upper barrier layer. The first portion 441 of the via 440 may be the portion of the via 440 that overlaps the etch stop layer 200 in the first direction D1.

The second portion 443 of the via 440 may include the second via material 420b and the second portion 410b of the upper barrier layer. The second portion 443 of the via 440 may be the portion of the via 440 that overlaps with the interlayer insulating layer 300 in the first direction D1. The second portion 443 of the via 440 may be the portion between the first portion 441 of the via 440 and the upper wire 430.

The upper wire 430 may be disposed in the interlayer insulating layer 300 and may be spaced apart from the lower wire 110. The upper wire 430 may include the first portion 410a of the upper barrier layer and the upper wire layer 420a.

The upper wire 430 and the via 440 may include the same material, for example. The upper wire 430 and the via 440 may include a conductive material, for example. The upper wire 430 and the via 440 may include at least one of aluminum (Al), copper (Cu), tungsten (W), cobalt (Co), and a combination thereof, according to an embodiment.

Figure 4:
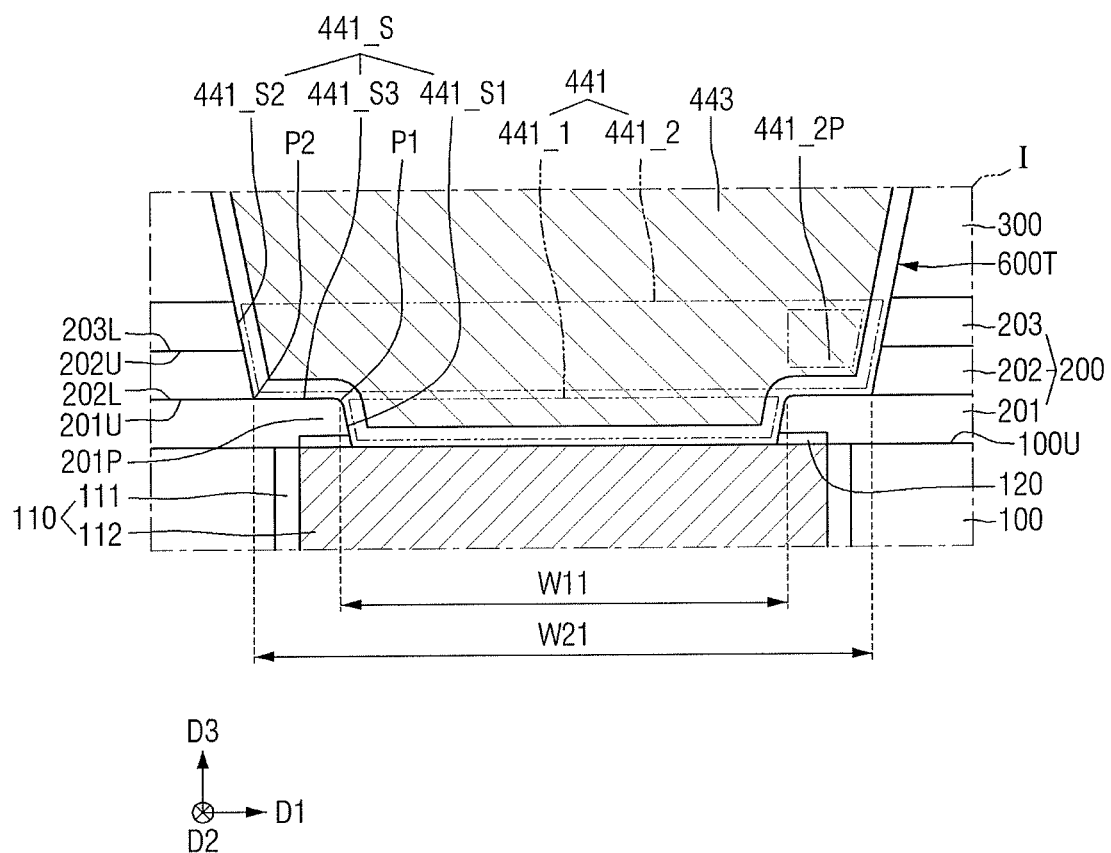
FIG. 4 is an enlarged view of area I of FIG. 2.
Figure 5:
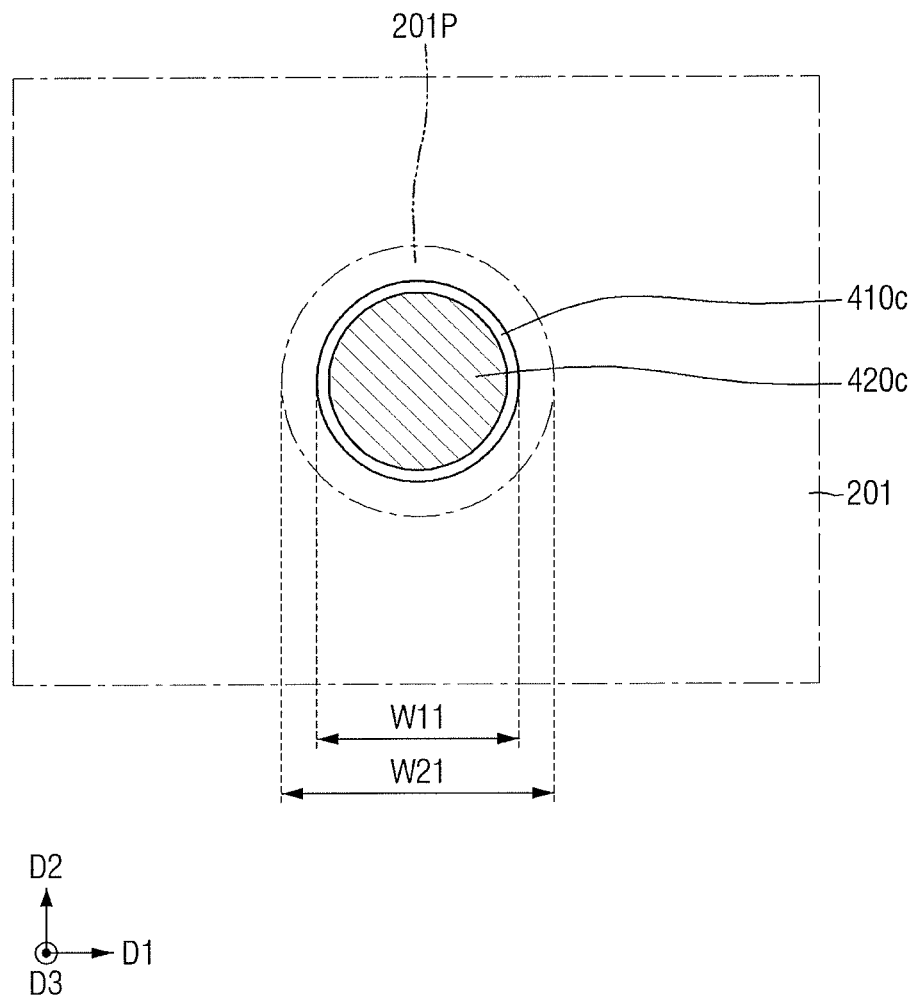
FIG. 5 is a plan view taken along line D-D' of FIG. 2.

FIG. 4 is an enlarged view of area I of FIG. 2. FIG. 5 is a plan view taken along line D-D' of FIG. 2.

Referring to FIGS. 2, 4 and 5, the sidewall 441_S of the first portion 441 of the via 440 may have a stepwise shape.

The sidewall 441_S of the first portion 441 of the via 440 may include a first sidewall 441_S1, a second sidewall 441_S2, and a third sidewall 441_S3 connecting the first sidewall 441_S1 with the second sidewall 441_S2. The first sidewall 441_S1 may be closer to the upper surface 100U of the substrate 100 than the second sidewall 441_S2 is.

The first sidewall 441_S1 may extend away from the substrate 100 and may be inclined by a first angle with respect to the upper surface 100U of the substrate 100. The second sidewall 441_S2 may extend away from the substrate 100 and may be inclined by a second angle with respect to an upper surface 201U of the first etch stop pattern 201. The first angle and the second angle may be, for example, acute angles. The first angle may or may not be equal to the second angle.

The third sidewall 441_S3 may extend in substantially parallel to the upper surface 100U of the substrate 100.

The first sidewall 441_S1 may meet the third sidewall 441_S3 at a first point P1. The third sidewall 441_S3 may meet the second sidewall 441_S2 at a second point P2.

In some embodiments, the third sidewall 441_S3 may be in contact with a part of the upper surface 201U of the first etch stop pattern 201. The second etch stop pattern 202 includes a first surface 202L and a second surface 202U opposed to each other, and the second surface 202U of the second etch stop pattern 202 faces a lower surface 203L of the third etch stop pattern 203, such that the upper surface 201U of the first etch stop pattern 201 may face the first surface 202L of the second etch stop pattern 202.

In some embodiments, the first portion 441 of the via 440 may include a third portion 441_1 in the first etch stop pattern 201, and a fourth portion 441_2 in the second etch stop pattern 202 and the third etch stop pattern 203. The fourth portion 441_2 of the via 440 may be disposed on the third portion 441_1 of the via 440.

The sidewall of the third portion 441_1 of the via 440 may be the first sidewall 441_S1. The sidewall of the fourth portion 441_2 of the via 440 may be the second sidewall 441_S2.

The third portion 441_1 of the via 440 may include the lower portion of the first via material 420c and the lower portion of the third portion 410c of the upper barrier layer. The fourth portion 441_2 of the via 440 may include the upper portion of the first via material 420c and the lower portion of the third portion 410c of the upper barrier layer.

In some embodiments, the third portion 441_1 of the via 440 may be surrounded by the first etch stop pattern 201.

The fourth portion 441_2 of the via 440 may be surrounded by the second etch stop pattern 202 and the third etch stop pattern 203.

In some embodiments, the fourth portion 441_2 of the via 440 may include a portion 441_2P that vertically overlaps with a part 201P of the first etch stop pattern 201 when viewed from the top. The part 201P of the first etch stop pattern 201 may be a part of the first etch stop pattern 201 protruding from the second sidewall 441_S2 in the first direction D1.

For example, the portion 441_2P of the fourth portion 441_2 of the via 440 may come in contact with a part of the upper surface 201U of the first etch stop pattern 201. The portion 441_2P of the fourth portion 441_2 of the via 440 may protrude from the third portion 441_1 of the via 440 in the first direction D1.

The width W11 of the third portion 441_1 of the via 440 may be smaller than the width W21 of the fourth portion 441_2 of the via 440. The width W11 of the third portion 441_1 of the via 440 may be a value measured at the first point P1, and the width W21 of the fourth portion 441_2 of the via 440 may be a value measured at the second point P2. In other words, the width W11 of the third portion 441_1 of the via 440 and the width W21 of the fourth portion 441_2 of the via 440 may be values measured at the boundary between the first etch stop pattern 201 and the second etch stop pattern 202.

In the semiconductor device according to some exemplary embodiments of the present disclosure, the first etch stop pattern 201 includes the part 201P that protrudes from the second sidewall 441_S2 of the via 440, such that the spacing between the lower wire 110 and another adjacent lower wire and between the lower wire 110 and the via 440. By doing so, leakage between the lower wire 110 and another adjacent lower wire and between the lower wire 110 and the via 440 can be suppressed.

Referring to FIGS. 2 and 4, the sidewall of the second portion 443 of the via 440, the second sidewall 441_S2 of the first portion 441 of the via 440 and the first sidewall 441_S1 of the first portion 442 of the via 440 are shown as having a slope that is not perpendicular to the upper surface 100U of the substrate 100 according to an embodiment.

Figure 6:
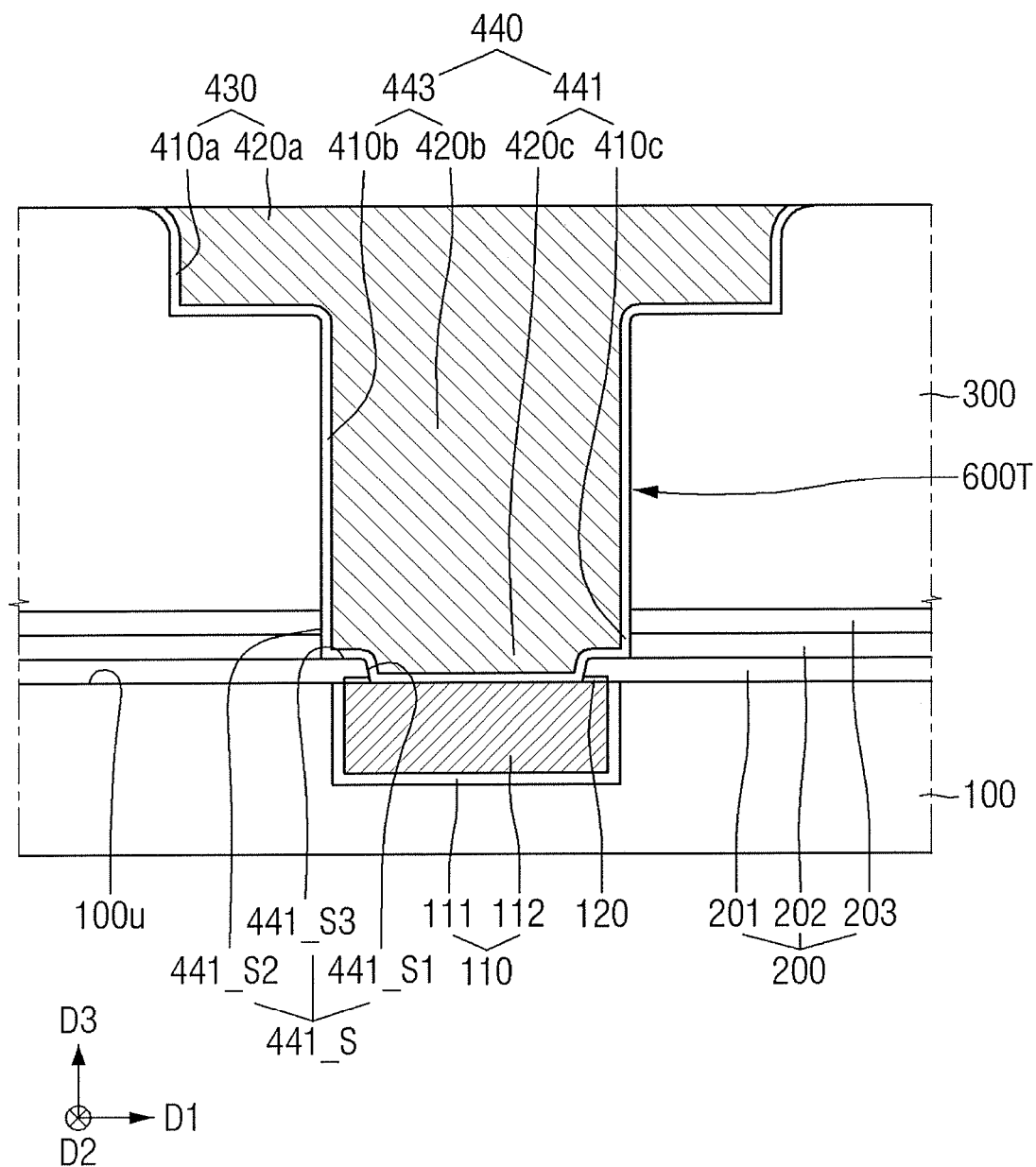
FIG. 6 is a cross-sectional view taken along line A-A' of FIG. 1 according to an embodiment.

FIG. 6 is a cross-sectional view taken along line A-A' of FIG. 1 according to an embodiment.

For example, as shown in FIG. 6, the sidewall of the second portion 443 of the via 440, the second sidewall 441_S2 of the first portion 441 of the via 440 and the first sidewall 441_S1 of the first portion 442 of the via 440 may have a slope that is perpendicular to the upper surface 100U of the substrate 100.

According to an embodiment, the sidewall of the second portion 443 of the via 440 and the second sidewall 441_S2 of the first portion 441 of the via 440 may have a slope that is substantially perpendicular to the upper surface 100U of the substrate 100, while the first sidewall 441_S1 of the first portion 441 of the via 440 may have a slope that is not perpendicular to the upper surface 100U of the substrate 100. Or, the sidewall of the second portion 443 of the via 440 and the second sidewall 441_S2 of the first portion 441 of the via 440 may have a slope that is not perpendicular to the upper surface 100U of the substrate 100, while the first sidewall 441_S1 of the first portion 441 of the via 440 may have a slope that is substantially perpendicular to the upper surface 100U of the substrate 100.

FIGS. 7 to 10, respectively, are cross-sectional views taken along line B-B' of FIG. 1 according to an embodiment.

Figure 7:
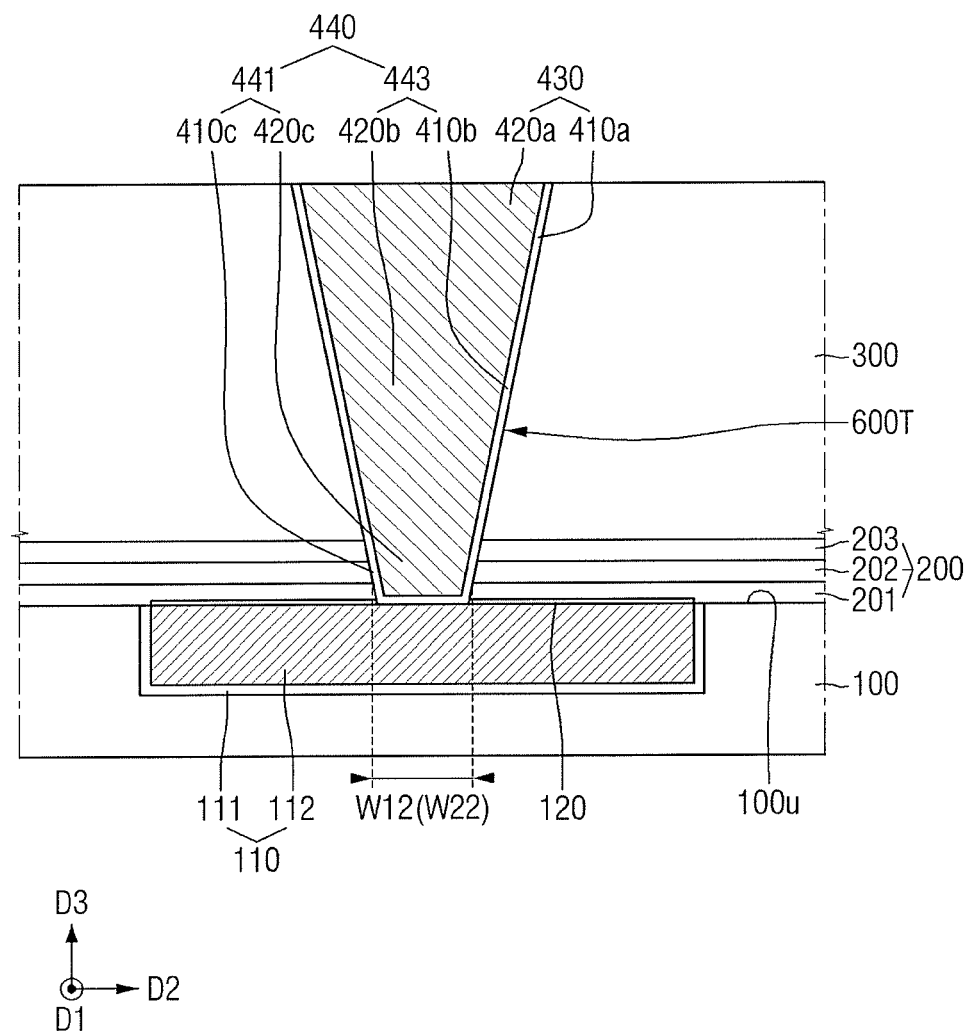
FIGS. 7 to 10, respectively, are cross-sectional views taken along line B-B' of FIG. 1 according to embodiment.
Figure 8:
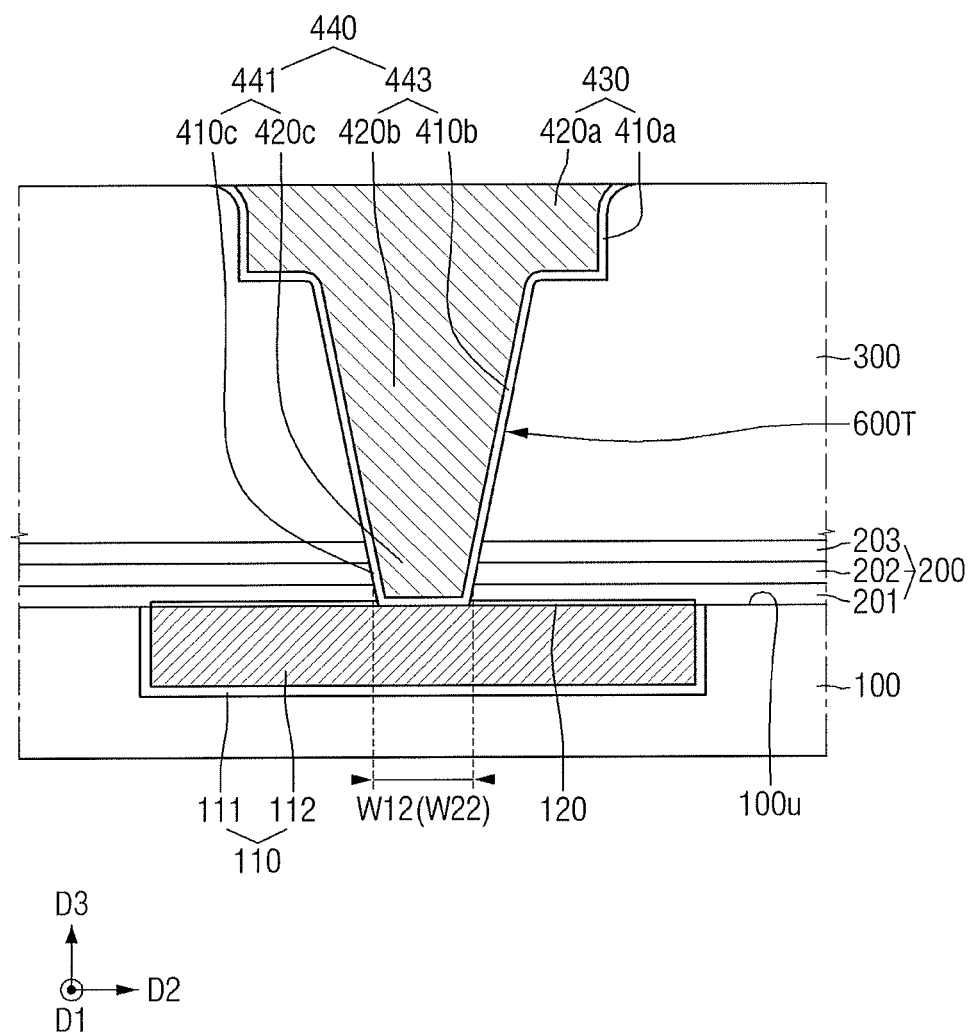

Referring to FIGS. 7 and 8, in some embodiments, at the boundary between the first etch stop pattern 201 and the second etch stop pattern 202, the width W12 of the via 440 in the first etch stop pattern 201 in the second direction D2 may be smaller than the width W22 of the via 440 in the second etch stop pattern 202 and the third etch stop pattern 203 in the second direction D2. The via 440 in the first etch stop pattern 201 may correspond to the third portion 441_1 of the via 440 (see FIG. 4). In addition, the via 440 in the second etch stop pattern 202 and the third etch stop pattern 203 may correspond to the fourth portion 441_2 of the via 440 (see FIG. 4).

In FIG. 7, the sidewall of the upper wire 430 and the sidewall of the via 440 have a certain slope, this is merely illustrative. For example, it is to be understood that they may having a shape shown in FIG. 8 depending on the semiconductor process to be applied.

Figure 9:
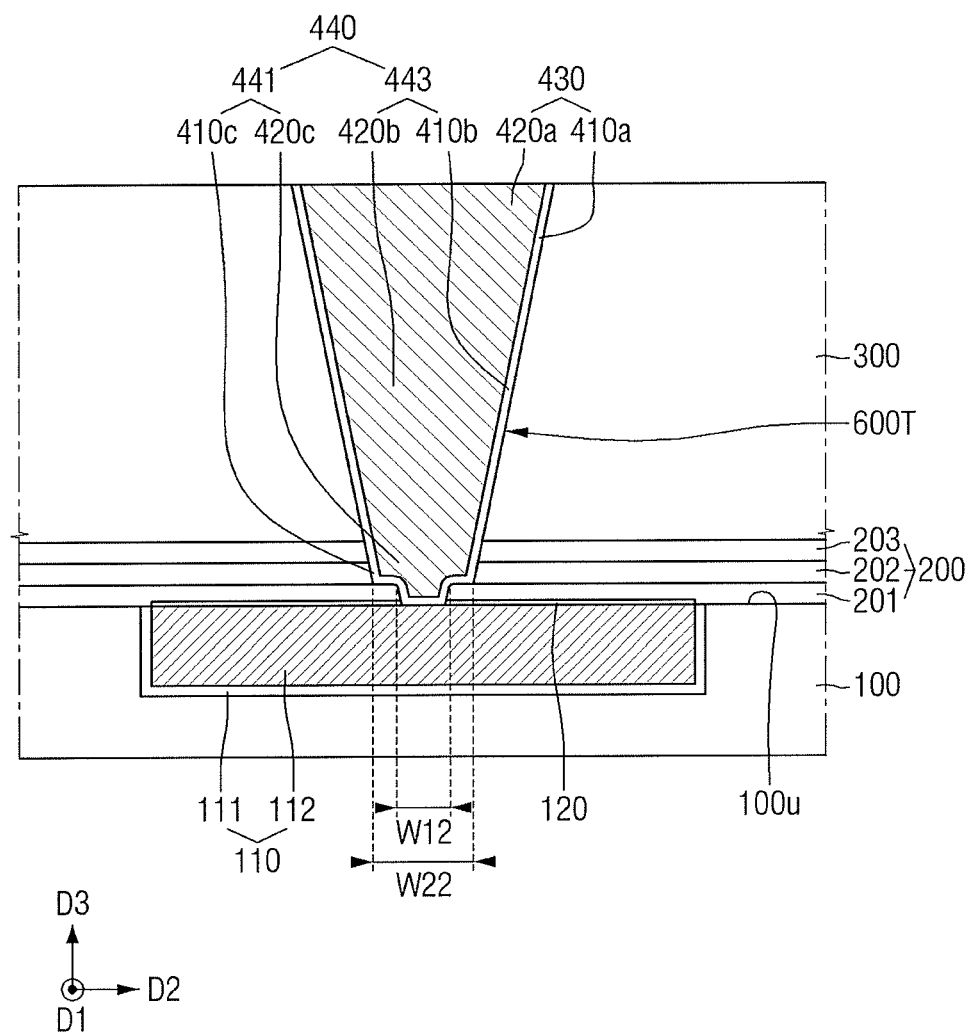
Figure 10:
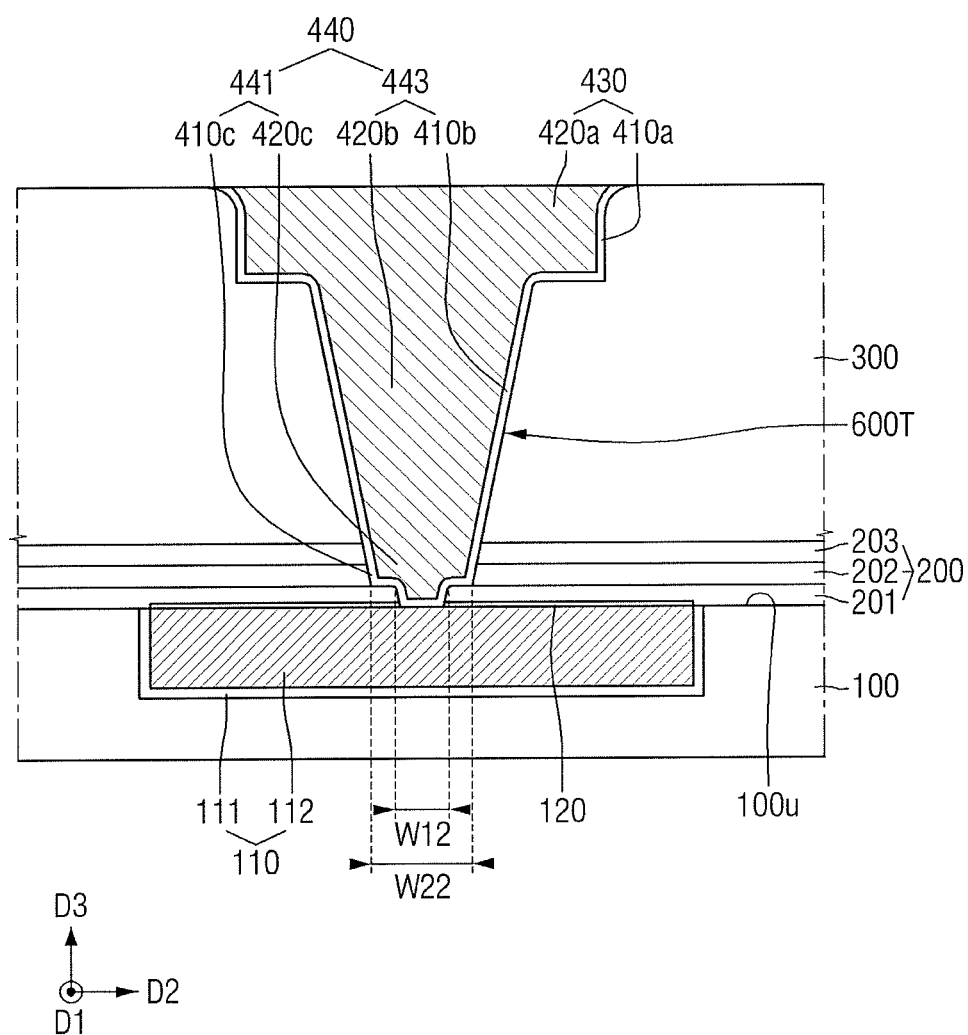

Referring to FIGS. 9 and 10, in some embodiments, at the boundary between the first etch stop pattern 201 and the second etch stop pattern 202, the width W12 of the via 440 in the first etch stop pattern 201 in the second direction D2 may be smaller than the width W22 of the via 440 in the second etch stop pattern 202 and the third etch stop pattern 203 in the second direction D2.

In FIG. 9, although the sidewall of the upper wire 430 and the sidewall of the via 440 are shown as having a certain slope, this is merely illustrative. It is to be understood that they may have a shape shown in FIG. 10, for example, depending on the semiconductor process to be applied.

Hereinafter, semiconductor devices according to some exemplary embodiments of the present disclosure will be described with reference to FIGS. 1, 11 to 16.

Figure 11:
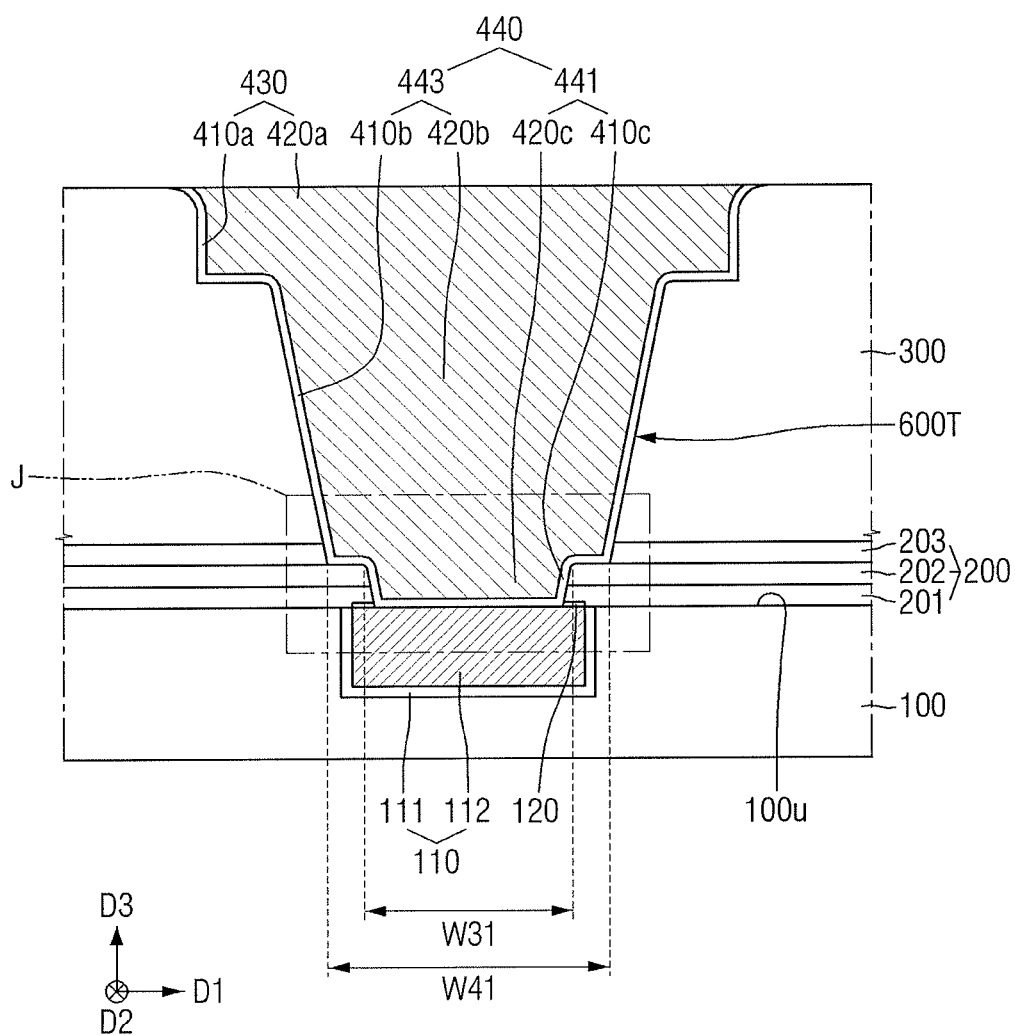
FIG. 11 is a cross-sectional view taken along line A-A' of FIG. 1 according to embodiment.
Figure 12:
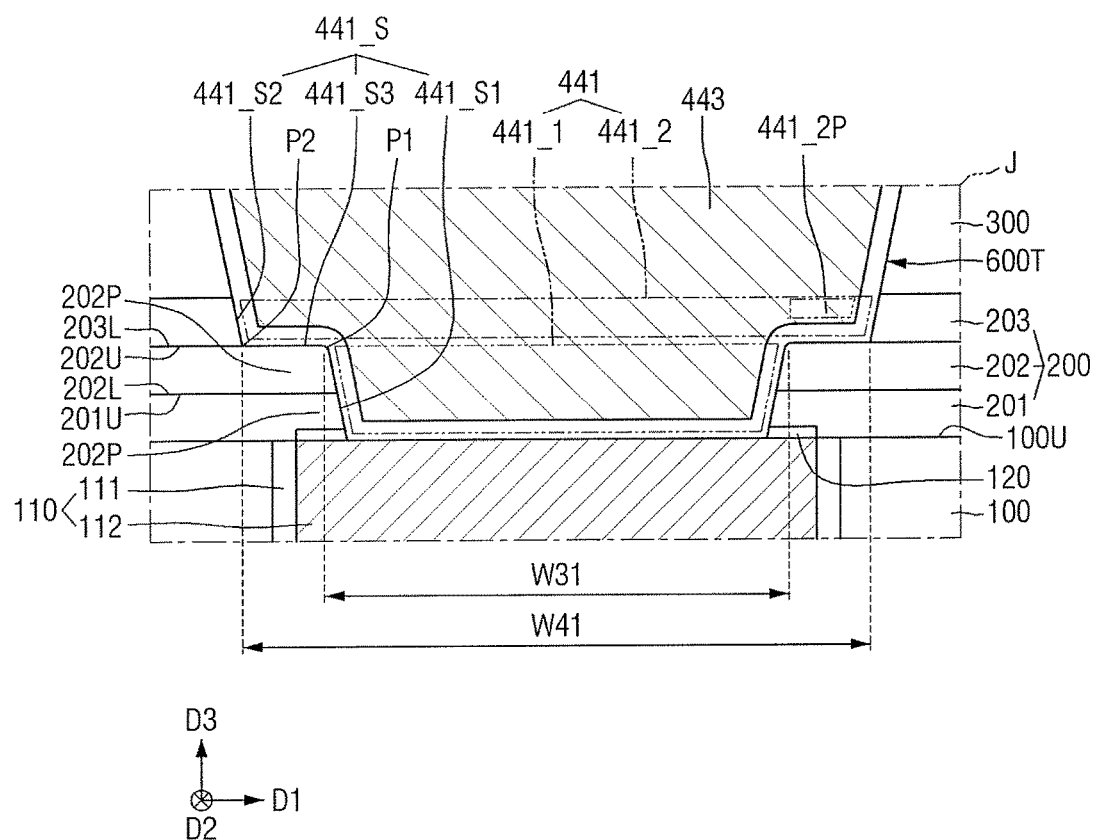
FIG. 12 is an enlarged view of area J of FIG. 11.

FIG. 11 is a cross-sectional view taken along line A-A' of FIG. 1 according to an embodiment. FIG. 12 is an enlarged view of area J of FIG. 11;

Referring to FIGS. 11 and 12, in a semiconductor device according to some embodiments of the present disclosure, a lower etch stop pattern may include a first etch stop pattern 201 and a second etch stop pattern 202, and a upper etch stop pattern may include a third etch stop pattern 203.

According to some exemplary embodiments of the present disclosure, the portion of the trench 600T that penetrates the etch stop layer 200 may include a portion defined by the first etch stop pattern 201 and the second etch stop pattern 202, and a portion defined by the third etch stop pattern 203.

According to some exemplary embodiments of the present disclosure, at the boundary between the first etch stop pattern 201 and the second etch stop pattern 202, the width of the portion of the trench 600T defined by the first etch stop pattern 201 and the second etch stop pattern 2020 may be smaller than the width of the portion of the trench 600T defined by the third etch stop pattern 203.

The portion of the trench 600T defined by the first etch stop pattern 201 and the second etch stop pattern 202 belonging to the lower etch stop pattern may be filled with the third portion 441_1 of the via 440. In addition, the portion of the trench 600T defined by the third etch stop pattern 203 belonging to the upper etch stop pattern may be filled with the fourth portion 441_2 of the via 440.

The third portion 441_1 of the via 440 may be in the first etch stop pattern 201 and the second etch stop pattern 202. The third portion 441_1 of the via 440 may surrounded by the first etch stop pattern 201 and the second etch stop pattern 202. The fourth portion 441_2 of the via 440 may be surrounded by the third etch stop pattern 203 in the third etch stop pattern 203.

The third sidewall 441_S3 of the sidewall 441_S of the via 440 may be in contact with a part of a second surface 202U of the second etch stop pattern 202, i.e., a part of the upper surface of the second etch stop pattern 202.

In some embodiments, the fourth portion 441_2 of the via 440 may include a portion 441_2P that vertically overlaps with a part 201P of the first etch stop pattern 201 and a part 202P of the second etch stop pattern 202 when viewed from the top. The part 201P of the second etch stop pattern 202 may be a part of the second etch stop pattern 202 protruding from the second sidewall 441_S2 in the first direction D1.

The portion 441_2P of the fourth portion 441_2 of the via 440 may come in contact with a part of the second surface 202U, i.e., the upper surface of the second etch stop pattern 202.

The width W31 of the third portion 441_1 of the via 440 may be smaller than the width W41 of the fourth portion 441_2 of the via 440. The width W31 of the third portion 441_1 of the via 440 may be a value measured at the first point P1, while the width W41 of the fourth portion 441_2 of the via 440 may be a value measured at the second point P2. In other words, the width W31 of the third portion 441_1 of the via 440 and the width W41 of the fourth portion 441_2 of the via 440 may be values measured at the boundary between the second etch stop pattern 202 and the third etch stop pattern 203.

FIGS. 13 to 16, respectively, are cross-sectional views taken along line B-B' of FIG. 1 according to an embodiment.

Figure 13:
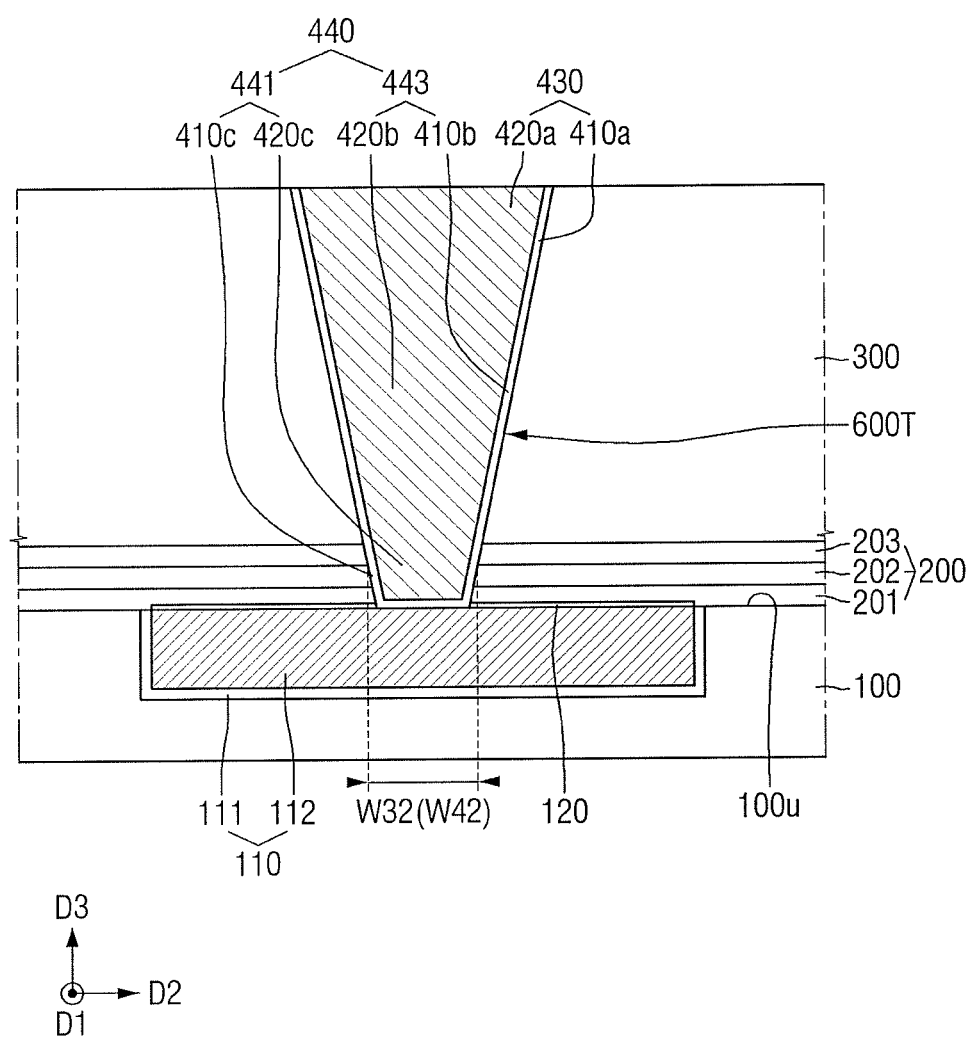
FIGS. 13 to 16, respectively, are cross-sectional views taken along line B-B' of FIG. 1 according to an embodiment.
Figure 14:
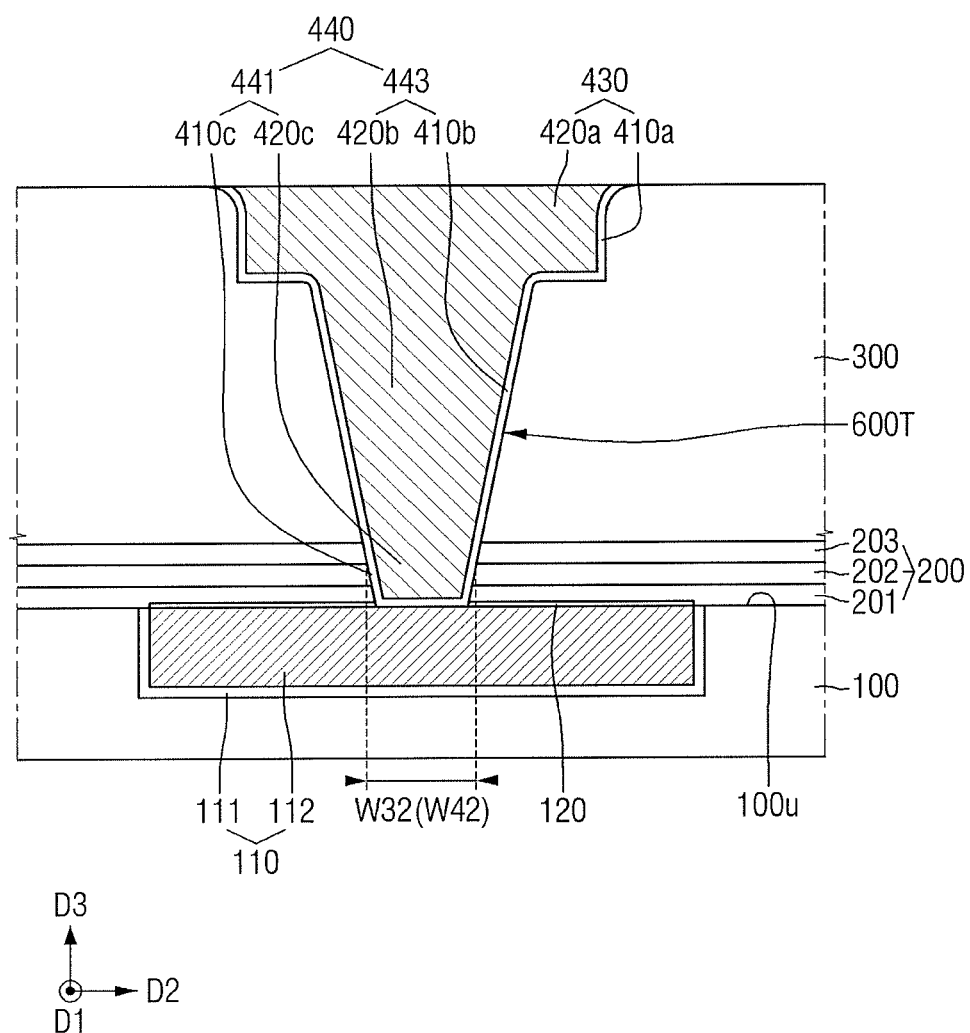

Referring to FIGS. 13 and 14, at the boundary between the second etch stop pattern 202 and the third etch stop pattern 203, the width W32 of the via 440 in the first etch stop pattern 201 and the second etch stop pattern 202 in the second direction D2 may be substantially equal to the width W42 of the via 440 in the third etch stop pattern 203 in the second direction D2. The via 440 in the first etch stop pattern 201 and the second etch stop pattern may correspond to the third portion 441_1 of the via 440 (see FIG. 11). In addition, the via 440 in the third etch stop pattern 203 may correspond to the fourth portion 441_2 of the via 440 (see FIG. 11).

In FIG. 13, although the sidewall of the upper wire 430 and the sidewall of the via 440 are shown as having a certain slope, this is merely illustrative. It is to be understood that they may have a shape shown in FIG. 14, for example, depending on the semiconductor process to be applied.

Figure 15:
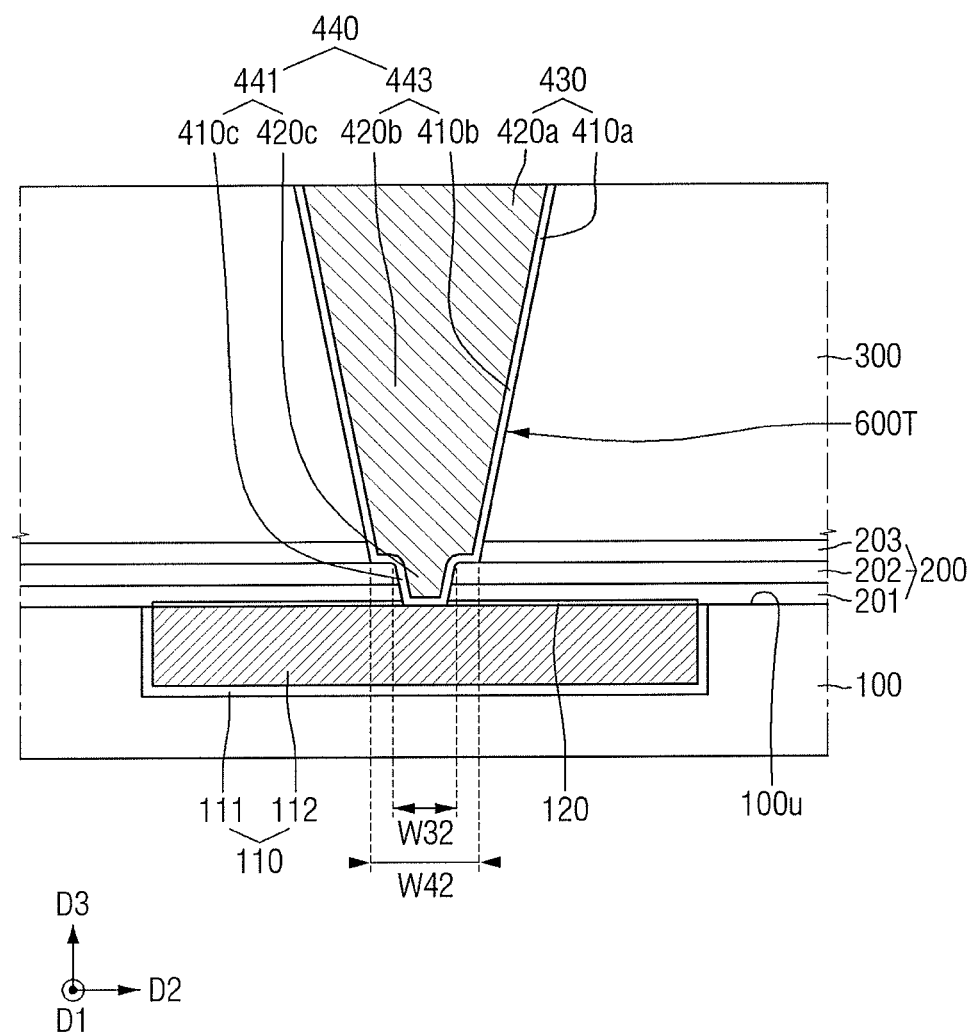
Figure 16:
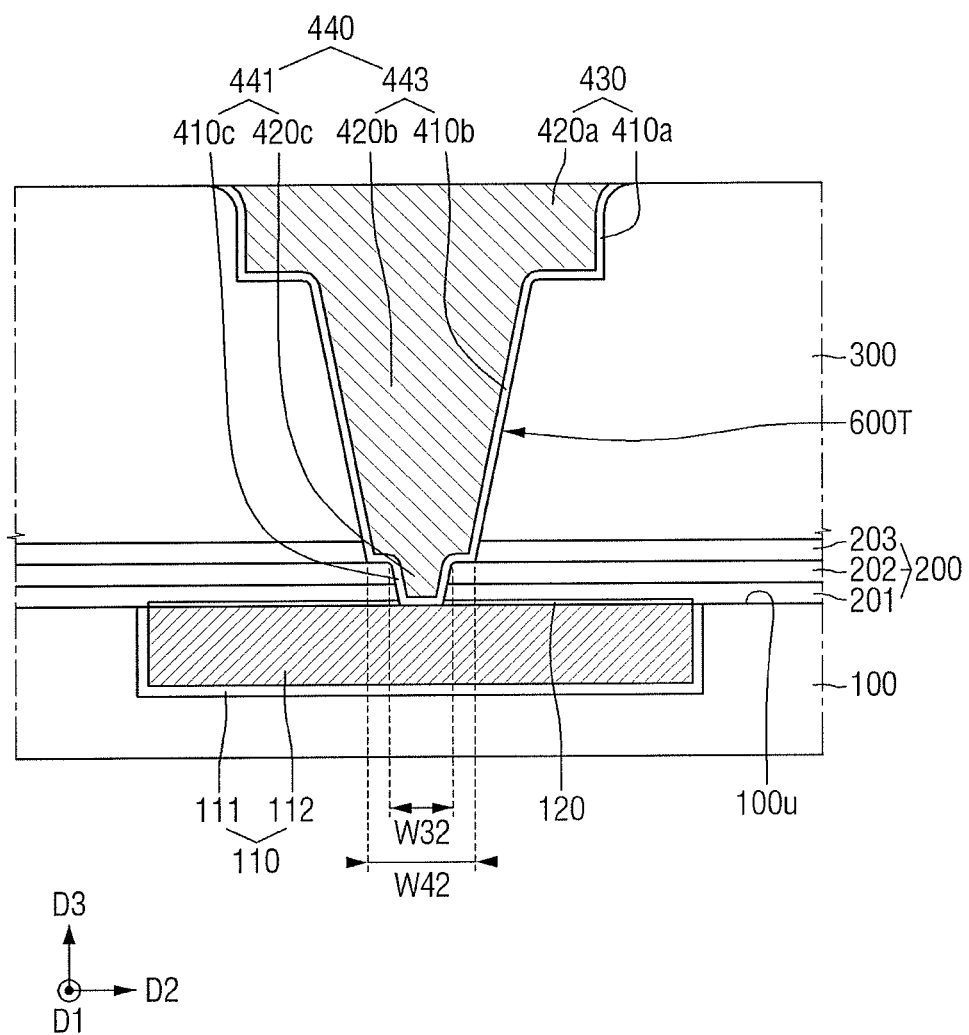

Referring to FIGS. 15 and 16, in some embodiments, at the boundary between the second etch stop pattern 202 and the third etch stop pattern 203, the width W32 of the via 440 in the first etch stop pattern 201 and the second etch stop pattern 202 in the second direction D2 may be smaller than the width W42 of the via 440 in the third etch stop pattern 203 in the second direction D2.

In FIG. 15, although the sidewall of the upper wire 430 and the sidewall of the via 440 are shown as having a certain slope, this is merely illustrative. It is to be understood that they may have a shape shown in FIG. 16, for example, depending on the semiconductor process to be applied.

Hereinafter, semiconductor devices according to some exemplary embodiments of the present disclosure will be described with reference to FIGS. 1, 17 to 22.

Figure 17:
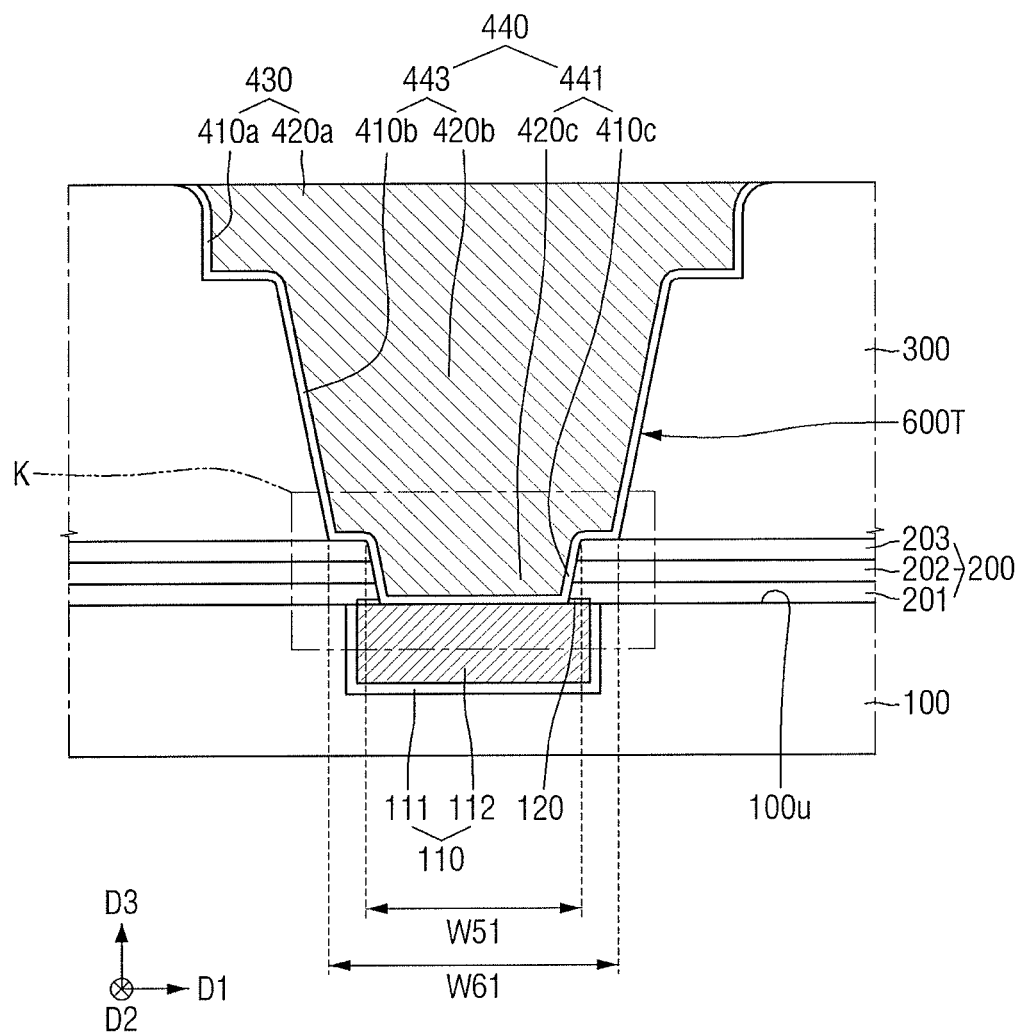
FIG. 17 is a cross-sectional view taken along line A-A' of FIG. 1 according to an embodiment.

FIG. 17 is a cross-sectional view taken along line A-A' of FIG. 1. FIG. 18 is an enlarged view of area K of FIG. 17.

Referring to FIGS. 17 and 18, at the boundary between the third etch stop pattern 203 and the interlayer insulating layer 300, the width W51 of the first portion 441 of the via 440 may be smaller than the width W61 of the second portion of the via 440.

The sidewalls of the via 440 may include a sidewall 441_S of the first portion 441 of the via 440 and sidewalls 443_S1 and 443_S2 of the second portion 443 of the via 440. The sidewall of the second portion 443 of the via 440 may include a fourth sidewall 443_S1 extending away from the third etch stop pattern 203, and a fifth sidewall 443_S2 connecting the sidewall 441_S of the first portion 441 of the via 440 with the fourth sidewall 443_S1.

The sidewall 441_S of the first portion of the via 440 may extend away from the substrate 100 and may be inclined by a third angle with respect to the upper surface 100U of the substrate 100. The fourth sidewall 443_S1 may be inclined at a fourth angle with respect to the upper surface 203U of the third etch stop pattern 203. The third angle and the fourth angle may be, for example, acute angles. The third angle may or may not be equal to the fourth angle.

The second portion 443 of the via 440 may include a portion 443P vertically overlapping a part 201P of the first etch stop pattern 201, a part 202P of the second etch stop pattern 202, and a part 203P of the third etch stop pattern 203 when viewed from the top. The part 201P of the first etch stop pattern 201, the part 202P of the second etch stop pattern 202 and the part 203P of the third etch stop pattern 203 may protrude from the sidewall of the second portion 443 of the via 440 in the first direction D1. The sidewall of the second portion 443 of the via 440 may be the boundary between the interlayer insulating layer 300 and the second portion 443 of the via 440, for example.

The portion 443P of the second portion 443 of the via 440 may come in contact with a part of the upper surface 203U of the third etch stop pattern 203.

FIGS. 19 to 22, respectively, are cross-sectional views taken along line B-B' of FIG. 1 according to an embodiment.

Figure 19:
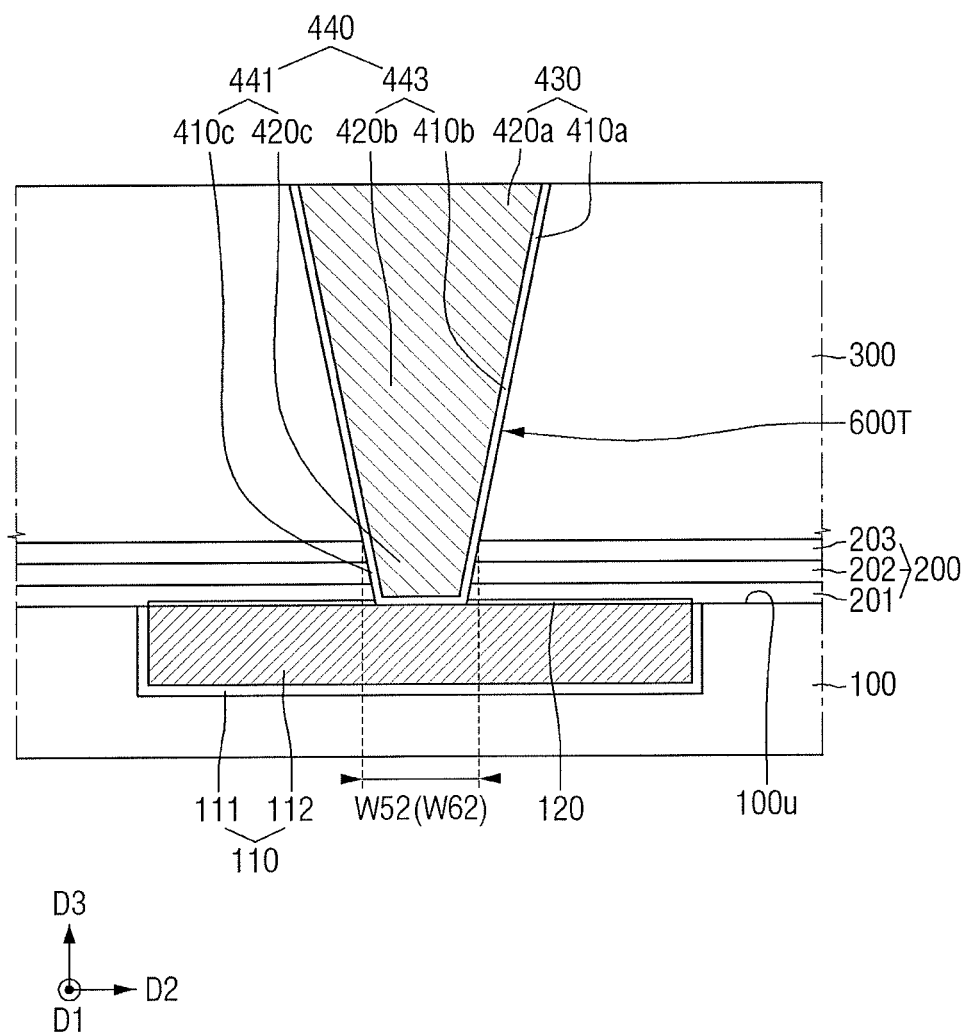
FIGS. 19 to 22, respectively, are cross-sectional views taken along line B-B' of FIG. 1 according to an embodiment.
Figure 20:
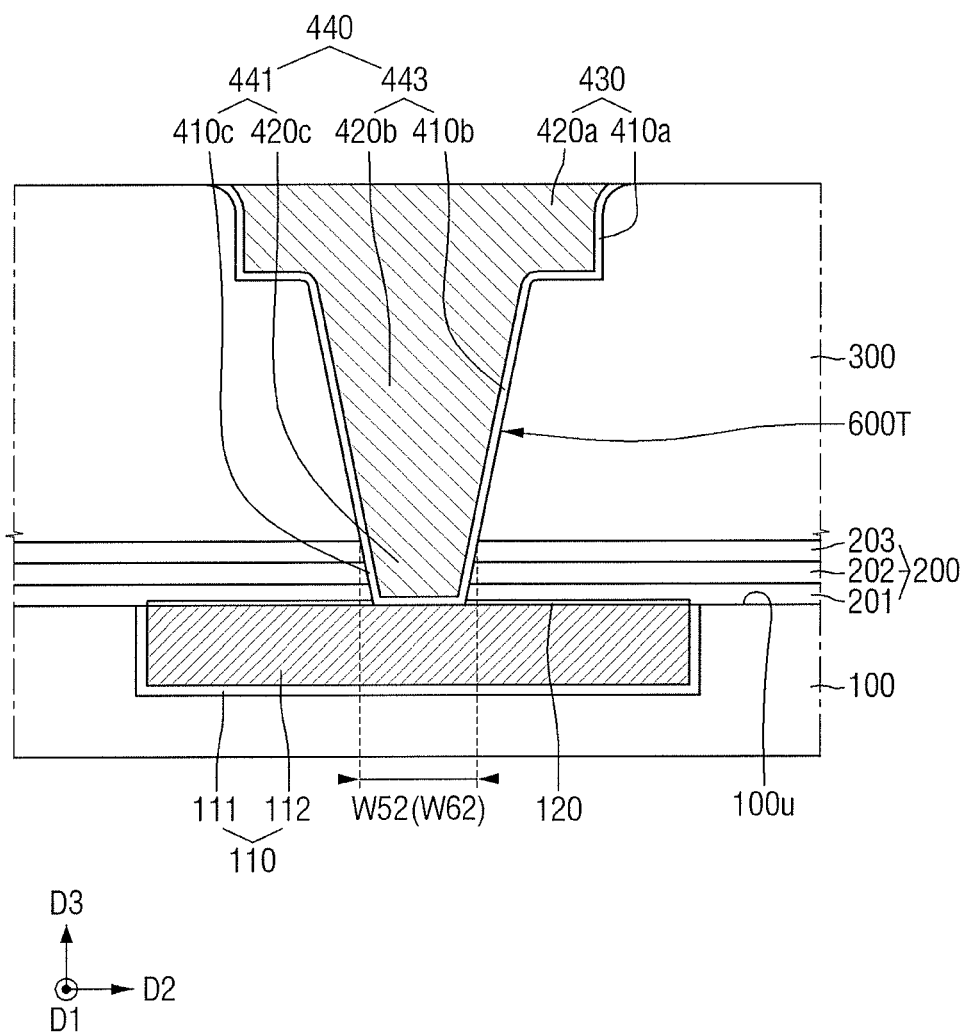

Referring to FIGS. 19 and 20, in some embodiments, at the boundary between the third etch stop pattern 203 and the interlayer insulating layer 300, the width W52 of the first portion 441 of the via 440 in the etch stop layer 200 may be substantially equal to the width W62 of the second portion 443 of the via 440 in the interlayer insulating layer 300 in the second direction D2.

In FIG. 19, although the sidewall of the upper wire 430 and the sidewall of the via 440 are shown as having a certain slope, this is merely illustrative. It is to be understood that they may have a shape shown in FIG. 20, for example, depending on the semiconductor process to be applied.

Figure 21:
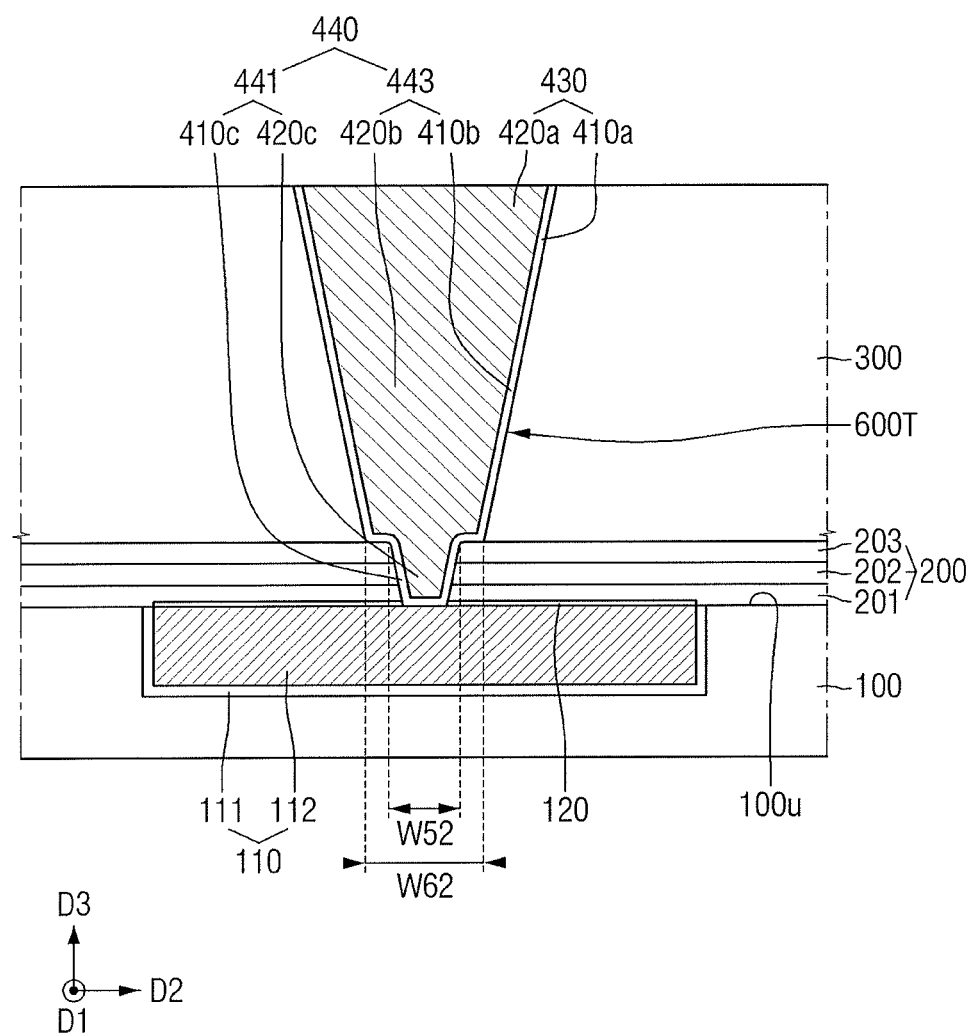
Figure 22:
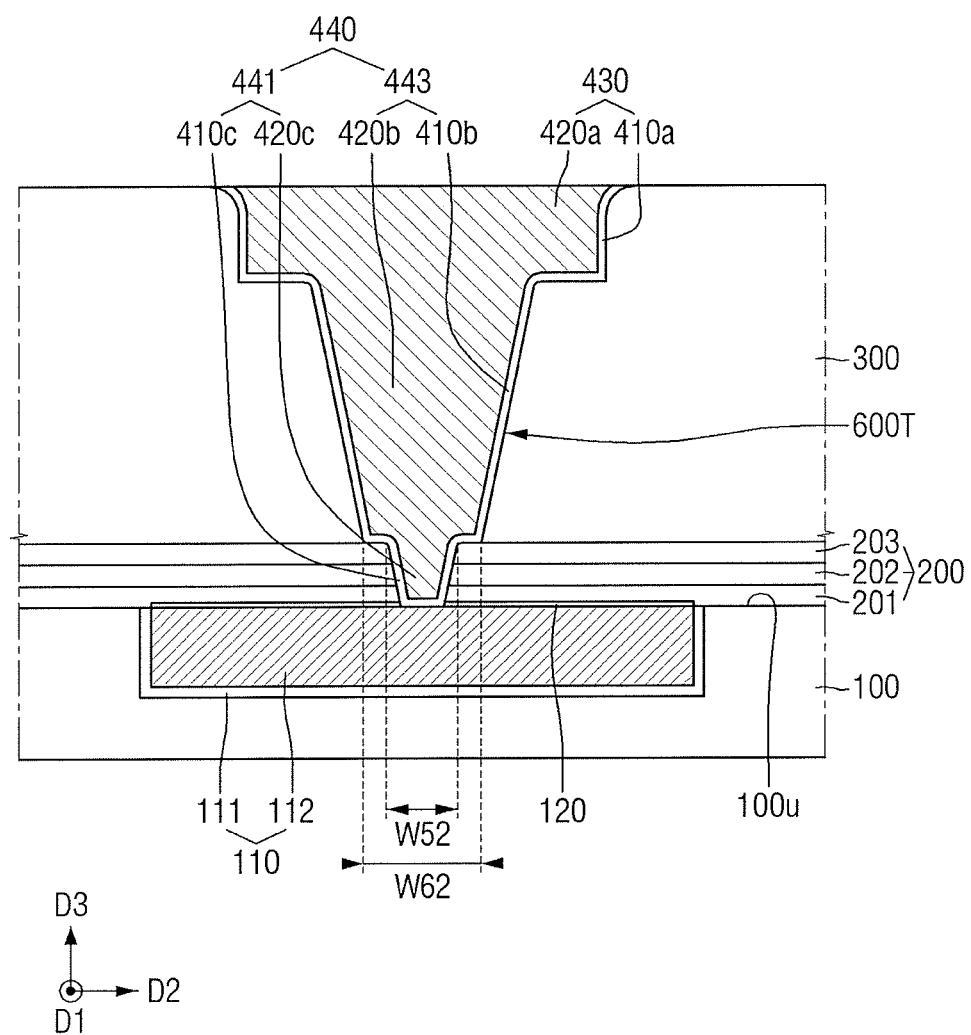

Referring to FIG. 21, in some embodiments, at the boundary between the third etch stop pattern 203 and the interlayer insulating layer 300, the width W52 of the first portion 441 of the via 440 in the second direction D2 may be smaller than the width W62 of the second portion 443 of the via 440 in the second direction D2.

In FIG. 21, although the sidewall of the upper wire 430 and the sidewall of the via 440 are shown as having a certain slope, this is merely illustrative. It is to be understood that they may have a shape shown in FIG. 22, for example, depending on the semiconductor process to be applied.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:
1. A semiconductor device comprising:
a substrate comprising a lower wire;

an etch stop layer on the substrate, the etch stop layer containing a metal element, the etch stop layer contacting the substrate;
an interlayer insulating layer on the etch stop layer;
an upper wire disposed in the interlayer insulating layer and separated from the lower wire; and
a via formed in the interlayer insulating layer and the etch stop layer and connecting the lower wire with the upper wire,
wherein the via comprises a first portion in the etch stop layer and a second portion in the interlayer insulating layer, and
wherein a sidewall of the first portion of the via comprises a step configuration.

2. The semiconductor device of claim 1, wherein the sidewall of the first portion of the via comprises first and second sidewalls extending away from the substrate, and a third sidewall connecting the first sidewall with the second sidewall.

3. The semiconductor device of claim 2, wherein the first sidewall is closer to an upper surface of the substrate than the second sidewall is,
wherein the first portion of the via comprises a third portion corresponds to the first sidewall, and a fourth portion corresponds to the second sidewall, and
wherein a width of the third portion of the via is smaller than a width of the fourth portion of the via.

4. The semiconductor device of claim 3, wherein the etch stop layer comprises first to third etch stop patterns stacked on one another sequentially,
wherein the first etch stop pattern surrounds the third portion of the via, and
wherein the second and third etch stop patterns surround the fourth portion of the via.

5. The semiconductor device of claim 2, wherein the etch stop layer comprises first to third etch stop patterns stacked on one another sequentially, and
wherein the third sidewall comes in contact with a part of an upper surface of the first etch stop pattern.

6. The semiconductor device of claim 2, wherein the etch stop layer comprises first to third etch stop patterns stacked on one another sequentially, and
wherein the third sidewall comes in contact with a part of an upper surface of the second etch stop pattern.

7. The semiconductor device of claim 1, wherein the etch stop layer comprises a lower etch stop pattern and an upper etch stop pattern stacked on the substrate sequentially,
wherein the first portion of the via comprises a third portion in the lower etch stop pattern and a fourth portion in the upper etch stop pattern, and
wherein a width of the third portion is smaller than a width of the fourth portion at a boundary between the lower etch stop pattern and the upper etch stop pattern.

8. The semiconductor device of claim 7, wherein the lower etch stop pattern comprises a first etch stop pattern on the substrate, and
wherein the upper etch stop pattern comprises second and third etch stop patterns stacked on the first etch stop pattern sequentially.

9. The semiconductor device of claim 7, wherein the lower etch stop pattern comprises first and second etch stop patterns stacked on the substrate sequentially, and
wherein the upper etch stop pattern comprises a third etch stop pattern stacked on the second etch stop pattern.

10. The semiconductor device of claim 1, wherein the etch stop layer comprises first to third etch stop patterns stacked on one another sequentially,
wherein the first etch stop pattern and the third etch stop pattern comprises a same material, and
wherein the second etch stop pattern comprises a different material from the material of the first and third etch stop patterns.

11. A semiconductor device comprising:
a substrate comprising a lower wire;
an etch stop layer containing a metal element, and comprising first to third etch stop patterns stacked on the substrate sequentially;
an interlayer insulating layer disposed on the third etch stop pattern;
an upper wire disposed in the interlayer insulating layer and separated from the lower wire; and
a via formed in the interlayer insulating layer and the etch stop layer and connecting the lower wire with the upper wire,
wherein the first etch stop pattern and the third etch stop pattern comprise a same material,
wherein the second etch stop pattern comprises a different material from the material of the first and third etch stop patterns, the second etch stop pattern comprising one or more of oxide doped carbon or SiCN, and
wherein a lower surface of the first etch stop pattern contacts the substrate, a part of an upper surface of the first etch stop pattern contacting the via.

12. The semiconductor device of claim 11, wherein the first etch stop pattern and the third etch stop pattern contain a same metal element, and
wherein the second etch stop pattern does not contain the metal element contained in the first and third etch stop patterns.

13. The semiconductor device of claim 11, wherein the first and third etch stop patterns contain aluminum element, and
wherein the second etch stop pattern does not contain the aluminum element.

14. The semiconductor device of claim 11, wherein the via comprises a first portion in the etch stop layer, and a second portion in the interlayer insulating layer, and
wherein a sidewall of the first portion of the via comprises a stepwise shape.

15. The semiconductor device of claim 11, wherein the via comprises a first portion in the etch stop layer, and a second portion in the interlayer insulating layer,
wherein the first portion of the via comprises a third portion having a first width and a fourth portion having a second width larger than the first width at a boundary between the first etch stop pattern and the second etch stop pattern, and
wherein the fourth portion is disposed on the third portion.

16. A semiconductor device comprising:
a substrate comprising a lower wire;
an etch stop layer containing a metal element, and comprising a lower etch stop pattern and an upper etch stop pattern stacked on the substrate sequentially, the lower etch stop pattern contacting the substrate;
an interlayer insulating layer disposed on the upper etch stop pattern;
an upper wire disposed in the interlayer insulating layer and comprising a longer side extended in a first direction; and
a via formed in the interlayer insulating layer and in the etch stop layer and connecting the lower wire with the upper wire,
wherein a first width of the via in the lower etch stop pattern in the first direction is smaller than a second width of the via in the upper etch stop pattern in the first direction at a boundary between the lower etch stop pattern and the upper etch stop pattern such that the upper etch stop pattern does not overlap a portion of an upper surface of the lower etch stop pattern at the boundary.

17. The semiconductor device of claim 16, wherein, at the boundary between the lower etch stop pattern and the upper etch stop pattern, a width of the via in the upper etch stop pattern in a second direction intersecting with the first direction is greater than a width of the via in the lower etch stop pattern in the second direction.

18. The semiconductor device of claim 16, wherein, at the boundary between the lower etch stop pattern and the upper etch stop pattern, a width of the via in the upper etch stop pattern in a second direction intersecting with the first direction is equal to a width of the via in the lower etch stop pattern in the second direction.

19. The semiconductor device of claim 16, wherein the lower etch stop pattern comprises a first etch stop pattern on the substrate, and wherein the upper etch stop pattern comprises second and third etch stop patterns stacked on the first etch stop pattern sequentially.

20. The semiconductor device of claim 16, wherein the lower etch stop pattern comprises first and second etch stop patterns stacked on the substrate sequentially, and wherein the upper etch stop pattern comprises a third etch stop pattern stacked on the second etch stop pattern.

* * * * *